United States Patent
Firehammer et al.

(10) Patent No.: US 9,793,724 B2
(45) Date of Patent: Oct. 17, 2017

(54) SYSTEM AND METHOD FOR MONITORING AND BALANCING VOLTAGE OF INDIVIDUAL BATTERY CELLS WITHIN A BATTERY PACK

(75) Inventors: Paul W. Firehammer, Saline, MI (US); Brian C. Moorhead, Willis, MI (US)

(73) Assignee: A123 Systems LLC, Livonia, MI (US)

( * ) Notice: Subject to any disclaimer, the term of this patent is extended or adjusted under 35 U.S.C. 154(b) by 1149 days.

(21) Appl. No.: 13/521,408

(22) PCT Filed: Jan. 10, 2011

(86) PCT No.: PCT/US2011/020692
§ 371 (c)(1),
(2), (4) Date: Jul. 17, 2012

(87) PCT Pub. No.: WO2011/085317
PCT Pub. Date: Jul. 14, 2011

(65) Prior Publication Data
US 2012/0286794 A1    Nov. 15, 2012

Related U.S. Application Data

(60) Provisional application No. 61/293,861, filed on Jan. 11, 2010.

(51) Int. Cl.
*G01N 27/416* (2006.01)
*H02J 7/00* (2006.01)
*H01M 10/42* (2006.01)
*H01M 10/44* (2006.01)
*H01M 10/48* (2006.01)
*G01R 31/36* (2006.01)
(Continued)

(52) U.S. Cl.
CPC ....... *H02J 7/0016* (2013.01); *H01M 10/4257* (2013.01); *H01M 10/441* (2013.01); *H01M 10/482* (2013.01); *G01R 31/3658* (2013.01); *H01M 2/1077* (2013.01); *H01M 10/613* (2015.04); *H01M 16/00* (2013.01); *H01M 2010/4271* (2013.01); *H01M 2220/20* (2013.01); *Y02T 10/7055* (2013.01)

(58) Field of Classification Search
CPC .... H02J 7/0016; H02J 7/0014; G01R 31/3658
USPC ......................... 320/122, 118, 119; 324/434
See application file for complete search history.

(56) References Cited

U.S. PATENT DOCUMENTS 5,814,970 A * 9/1998 Schmidt ............. H01M 10/441
                                                        320/118
5,850,136 A * 12/1998 Kaneko ................ H02J 7/0016
                                                        320/119
(Continued)

OTHER PUBLICATIONS

ISA Korea, International Search Report and Written Opinion of PCT/US2011/020692, Sep. 23, 2011, WIPO, 9 pages.

*Primary Examiner* — Richard Isla Rodas
*Assistant Examiner* — Johali Torres Ruiz
(74) *Attorney, Agent, or Firm* — McCoy Russell LLP

(57) ABSTRACT

Systems and methods for a scalable battery controller are disclosed. In one example, a circuit board coupled to a battery cell stack is designed to be configurable to monitor and balance battery cells of battery cell stacks that may vary depending on battery pack requirements. Further, the battery pack control module may configure software instructions in response to a voltage at a battery cell stack.

20 Claims, 8 Drawing Sheets

(51) Int. Cl.
*H01M 2/10* (2006.01)
*H01M 16/00* (2006.01)
*H01M 10/613* (2014.01)

(56) References Cited

U.S. PATENT DOCUMENTS

| | | | |
|---|---|---|---|
| 7,126,310 | B1 | 10/2006 | Barron |
| 7,466,104 | B2 | 12/2008 | Wang et al. |
| 8,120,321 | B2 * | 2/2012 | Vezzini ................ H02J 7/0014 |
| | | | 307/66 |
| 9,041,322 | B2 * | 5/2015 | Shimizu .................... B25F 5/02 |
| | | | 318/139 |
| 2002/0044433 | A1 * | 4/2002 | Inoue .................... H05K 1/029 |
| | | | 361/784 |
| 2005/0017682 | A1 | 1/2005 | Canter et al. |
| 2007/0004290 | A1 | 1/2007 | Moltion |
| 2008/0018300 | A1 | 1/2008 | Zaag et al. |
| 2008/0278221 | A1 * | 11/2008 | Rowland .............. H02J 7/0016 |
| | | | 327/536 |
| 2008/0309286 | A1 * | 12/2008 | Hoff ...................... H02J 7/0016 |
| | | | 320/107 |
| 2009/0015206 | A1 * | 1/2009 | Seman, Jr. ............ H02J 7/0019 |
| | | | 320/134 |
| 2009/0268415 | A1 * | 10/2009 | Anupindi .......... H01M 10/4207 |
| | | | 361/748 |
| 2010/0134115 | A1 * | 6/2010 | Ohnuki ............... B60L 11/1861 |
| | | | 324/429 |
| 2012/0249078 | A1 * | 10/2012 | Kim ........................ H02J 3/32 |
| | | | 320/134 |

\* cited by examiner

SYSTEM AND METHOD FOR MONITORING AND BALANCING VOLTAGE OF INDIVIDUAL BATTERY CELLS WITHIN A BATTERY PACK

CROSS REFERENCE TO RELATED APPLICATIONS

This application claims priority from International Patent Application Serial No. PCT/US2011/020692, filed Jan. 10, 2011 and entitled SYSTEM AND METHOD FOR MONITORING AND BALANCING VOLTAGE OF INDIVIDUAL BATTERY CELLS WITHIN A BATTERY PACK, which claims priority to U.S. Provisional Patent Application Ser. No. 61/293,861, filed Jan. 11, 2010 and entitled SYSTEM AND METHOD FOR MONITORING AND BALANCING VOLTAGE OF INDIVIDUAL BATTERY CELLS WITHIN A BATTERY PACK, the entirety of both of which are hereby incorporated herein by reference for all intents and purposes.

TECHNICAL FIELD

The present description relates to a scalable system for constructing and operating a battery pack supplying power to a vehicle.

BACKGROUND AND SUMMARY

In an effort to reduce vehicle emissions and reduce reliance on limited oil reserves, manufactures are increasingly moving toward battery packs as a mobile power source. In some vehicle configurations the battery pack augments an internal combustion engine while in other applications the battery pack is the sole source of energy used to propel the vehicle. Thus, there is a need for a variety of battery packs that have different voltage and current output. Further, as battery packs are integrated into an increasing variety of vehicle types, vehicle packaging constraints may limit battery pack volume and geometry. Accordingly, battery packs may have different packaging constraints and power requirements for different applications. The inventors herein have recognized that it may be cost prohibitive to redesign and repackage battery components for all applications. Further, it is unlikely that a single or a few special purpose designs would be suitable for a wide range of applications. Accordingly, the inventors herein have developed a system for controlling monitoring and voltage balancing of individual battery cells within a battery pack supplying power to a vehicle, comprising: a circuit board comprising a plurality of battery cell monitor and voltage balance circuits, said plurality of battery cell monitor and balance circuits configurable to monitor a variable number of battery cells, a number of said plurality of battery cell monitor and voltage balance circuits populated corresponding to a number of battery cells monitored.

A battery cell monitor and voltage balance board that is scalable may allow a battery pack manufacturer to reduce design cost and time. Further, a scalable design for battery cell monitor and voltage balance boards may allow a battery pack to be comprised of one or more battery cell stacks that vary in a number of battery cells. Thus, a scalable battery cell monitor and voltage balance board may provide a way to easily vary the geometric design of a battery pack to accommodate varying customer packaging requirements.

The present description may provide several advantages. For example, the approach may lower system design costs by permitting a single battery monitor and voltage balance board design to be used to construct a plurality of battery pack configurations. In addition, the present approach may reduce system cost since battery control electronics and control software may not have to be redesigned for every application. Further, the approach may allow for the construction of a wide variety of battery pack geometries. Further still, the approach draws substantially equal amounts of current from battery cells powering control circuitry. Further still, the approach has redundant checks to ensure proper system configuration.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION OF THE DEPICTED EMBODIMENTS

Figure 1:
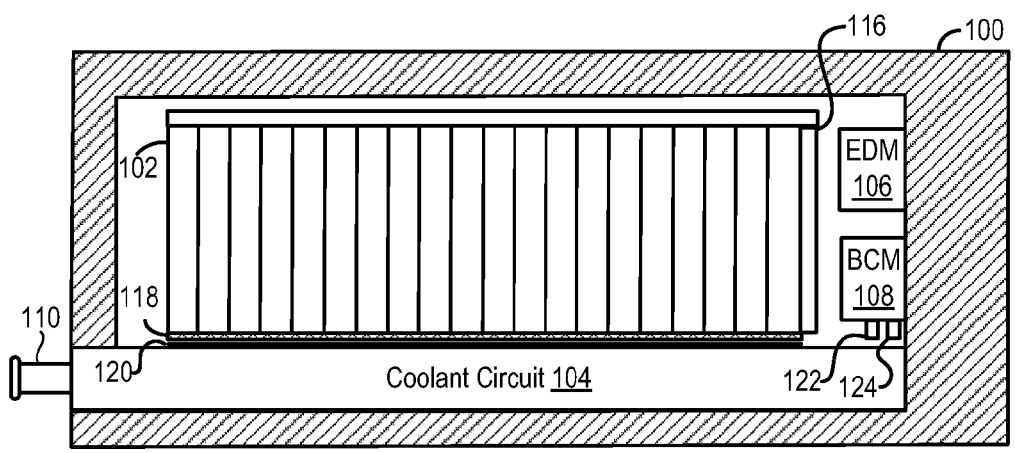
FIG. 1 shows a schematic view of a battery control system.
Figure 2:
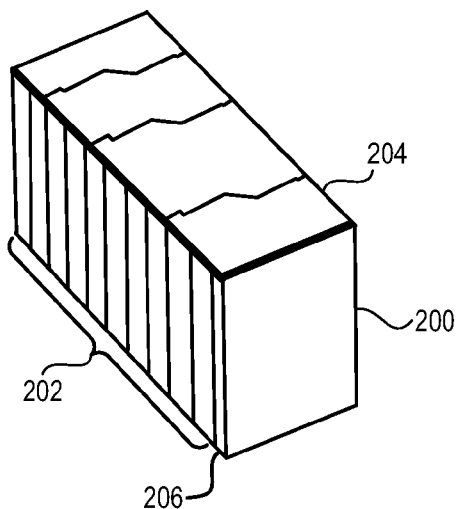
FIG. 2 shows a schematic view of an exemplary assembly of a battery cell stack.
Figure 3:
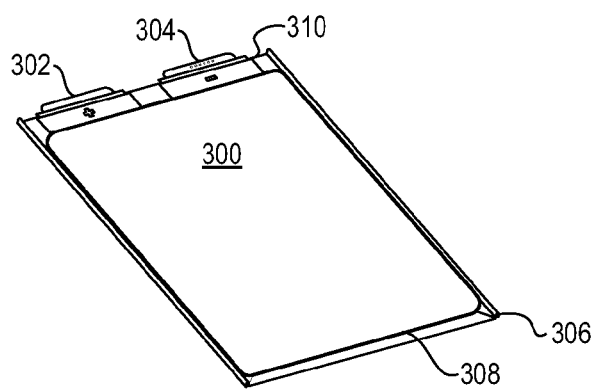
FIG. 3 shows a schematic view of an exemplary battery cell.

The present description is related to controlling voltage of individual battery cells within a battery pack supplying power to a vehicle. In one embodiment, the battery pack may be designed to include an enclosure and structure as is illustrated in FIG. 1. The battery pack may be comprised of one or more battery cell stacks, one of which is illustrated in FIG. 2. The battery cell stacks are comprised of a plurality of battery cells, one of which is illustrated in FIG. 3. Battery cell voltage monitoring and balancing is provided by scalable circuitry as is illustrated in FIG. 4-7.

Referring now to FIG. 1, an example battery pack 100 is illustrated. Battery pack 100 includes battery cell stack 102, coolant circuit 104, electrical distribution module (EDM) 106, and BCM 108. In the depicted embodiment, coolant enters the coolant circuit at coolant connector 110. Further, coolant circuit 104 is in thermal communication with battery cell stack 102 via conductive grease 118 and a cold plate 120. When heat is generated by cell stack 102, coolant circuit 104 transfers the heat to a location outside of battery pack 100. In one embodiment, coolant circuit 104 may be in communication with a vehicle radiator when the battery pack is coupled in a vehicle.

Voltage of battery cells in battery cell stack 102 is monitored and balanced by monitor and balance board (MBB) 116, which may include a plurality of current, voltage, and other sensors. The EDM 106 controls the distribution of power from the battery pack to the battery load. In particular, EDM 106 contains contacts for coupling high voltage battery power to an external battery load such as an inverter. The BCM 108 controls ancillary modules within the battery pack such as the EDM and cell MBB, for example. Further, the BCM may be comprised of a microprocessor having random access memory, read only memory, input ports, real time clock, and output ports. Humidity sensor 122 and temperature sensor 124 provide internal environmental conditions of battery pack 100 to BCM 108.

Referring now to FIG. 2, an exemplary assembly of a battery stack 200 is shown. Battery stack 200 is comprised of a plurality of battery cells 202. In some embodiments, the battery cells may be lithium-ion battery cells, for example. In the example of FIG. 2, battery stack is comprised of ten battery cells. Although battery stack 200 is depicted as having ten battery cells, it should be understood that a battery stack may include more or less than ten cells. For example, the number of cells in a battery stack may be based on an amount of power desired from the battery stack. Within a battery cell stack, cells may be coupled in series to increase the battery cell stack voltage, or battery cells may be coupled in parallel to increase current capacity at a particular battery cell voltage. Further, a battery pack, such as battery pack 100 in FIG. 1, may be comprised of one or more battery stacks. As shown in FIG. 2, battery stack 200 further includes cover 204 which provides protection for battery bus bars (not shown) that route charge from the plurality of battery cells to output terminals of a battery pack. Battery stack 200 also includes one or more MBB 206. MBB 206 is shown at the front end of battery stack 200, but an additional MBB may be included at the back or opposite side of battery stack 200 depending on the battery stack configuration.

Turning now to FIG. 3, an exemplary embodiment of an individual battery cell is shown. Battery cell 300 includes cathode 302 and anode 304 for connecting to a bus (not shown). The bus routes charge from a plurality of battery plates to output terminals of a battery pack and is coupled to bus bar support 310. Battery cell 300 further includes prismatic cell 308 that contains electrolytic compounds. Prismatic cell 308 is in communication with heat sink 306. Heat sink 306 may be formed of a metal plate with the edges bent up 90 degrees on one or more sides to form a flanged edge. In the example of FIG. 3, the bottom edge, and sides, each include a flanged edge.

When a plurality of cells is put into a stack, the Prismatic cells are separated by a compliant pad (not shown). Thus, a battery cell stack is built in the order of heat sink, Prismatic cell, compliant pad, Prismatic cell, heat sink, and so on. One side of the heat sinks (e.g., flanged edges) may then contact the cold plate to improve heat transfer.

Figure 4:
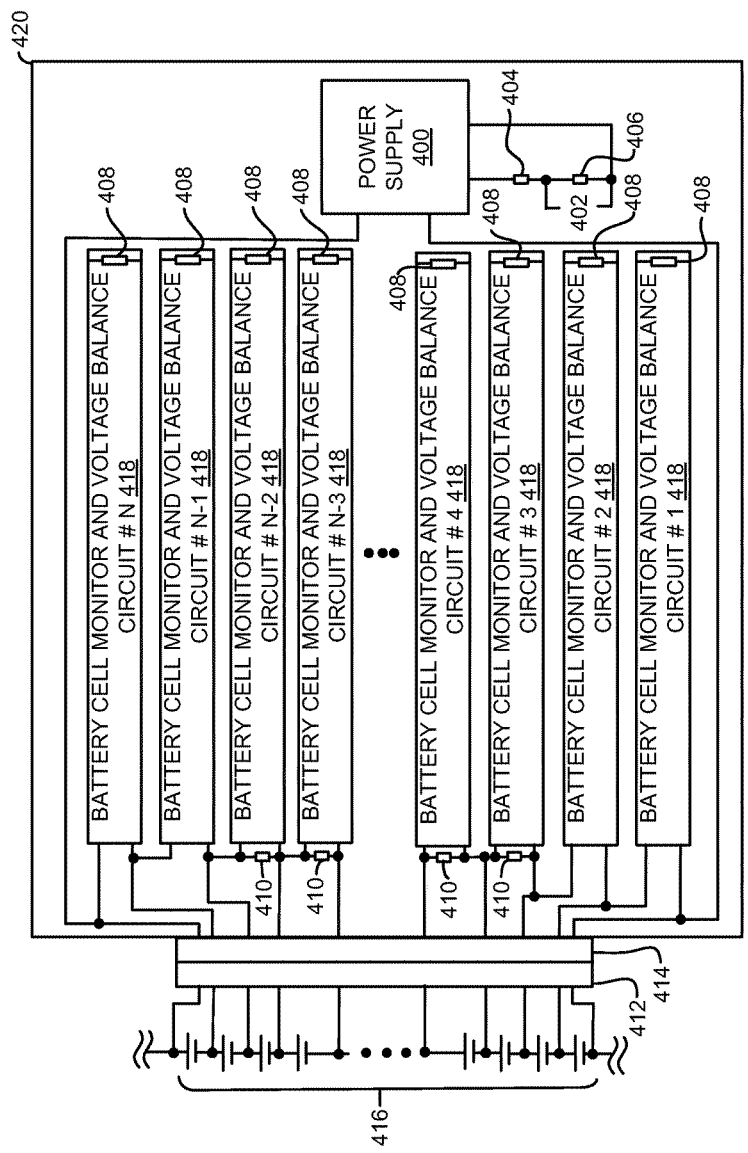
FIG. 4 shows a schematic diagram of battery cell monitoring and balancing hardware.

Referring now to FIG. 4, a schematic diagram of battery cell monitoring and balancing hardware is shown. As depicted, the system includes a plurality of battery cells 416, from 1-N monitoring and balancing circuits 418, connectors 412 and 414, and power supply 400.

In the example of FIG. 4, each of the plurality of battery cells 416 is shown coupled in series. The dots between battery cells indicate that additional battery cells may be included in the circuit. Battery cells 416 are coupled to MBB 420 by way of connectors 412 and 414.

MBB 420 includes power supply 400, configuration resistors 404 and 406, as well as a plurality of battery cell monitor and balance circuits 1-N 418. Monitor and balance circuits are arranged from 1 to N, where N is the maximum number of cells. If less than N battery cells are to be monitored, circuits are depopulated from the center of the monitor and balance board outward towards cell 1 and cell N. Battery cell monitor and balance circuits 418 may be configured with zero ohm jumpers 410 and bias resistors 408. In one embodiment, the number of battery cell monitor and balance circuits may be configured as a fixed number, such as 16, and the number of populated circuits varied depending on design requirements of the battery pack.

Power supply 400 is shown connected in parallel with all battery cells 416 of a battery cell stack. Power supply 400 is selected to function over a range of voltages so that a single power supply may be used over a range of battery cell stack voltages. Further, power supply 400 is selected such that it is of a type that draws substantially the same amount of current over a range of voltages. By drawing substantially constant current over a range of voltages, the power may be coupled to battery cell stacks that have different numbers of battery cells and different battery cell configurations while uniformly discharging battery cells of different battery cell stacks. Thus, although each battery cell stack may include a different number of battery cells and an MBB, the battery cells of different battery stacks will be discharged by different MBBs at substantially the same rate. Consequently, the possibility of different MBBs inducing charge imbalance between different battery cells of different battery cell stacks is reduced. The configuration illustrated by FIG. 4 allows power supply 400 to be coupled to a wide range of battery cell stacks further promoting a scalable system design.

In one embodiment, power supply 400 is a linear pass regulated power supply configured to draw a substantially constant current from a battery cell stack. For example, power supply 400 may be configured to draw 20 mA from a battery cell stack comprising six battery cells to which it is coupled. Power supply 400 draws 20 mA from the six battery cell stack whether the stack is fully or partially charged. If power supply 400 is alternatively coupled to a battery cell stack comprising twelve battery cells, power supply 400 will also draw 20 mA. Thus, even though the voltage of the twelve cell battery cell stack may be higher than the voltage of the six cell battery stack, battery cells of the two cell stacks are drained of charge substantially equally. Consequently, power supply 400 may consume more power when coupled to a twelve cell battery cell stack as compared to when coupled to a six cell battery cell stack, but the possibility of inducing charge imbalance between battery cells may be reduced. A power supply that draws a substantially constant current over a range of voltages may be more desirable than a power supply that draws a varying amount of current over a range of voltages (e.g., a switching power supply) because reducing the possibility of battery cell imbalance may reduce battery degradation.

It should be noted that power supply 400 may be activated by an input from the BCM or by other method. Further, the power supply configuration illustrated in FIG. 4 allows a first power supply to be coupled to a first group of battery cells, the first group of battery cells configured to output a first voltage, the first voltage input to the first power supply. Further, the configuration of FIG. 4 allows a second power supply to be coupled to a second group of battery cells, the second group of battery cells configured to output a second voltage, the second voltage input to the second power supply, the first and second power supplies draining the first and second group of battery cells of charge substantially equally.

MBB 420 also includes configuration resistors 404 and 406 for identifying the MBB configuration (e.g., the number of populated battery cell monitor and balance circuits). Resistors 404 and 406 are selected such that a unique voltage 402 appears across one resistor (e.g., 406) when resistors 404 and 406 are coupled in series to the output of voltage supply 400. For example, for a MBB configured to include up to 16 battery cells and having a power supply output voltage of 5 volts, zero battery cells may be indicated by 0.5 volts. Every additional battery cell configured in the battery cell stack may be indicated by an additional 0.25 volts as measured across one of the configuration load resistors. Thus, an eight battery cell stack would be indicated by 2.25 volts across the load resistor. It should be noted that the power supply output may be greater than or less than 5 volts and the above example is not intended to limit the scope of the description.

Figure 5:
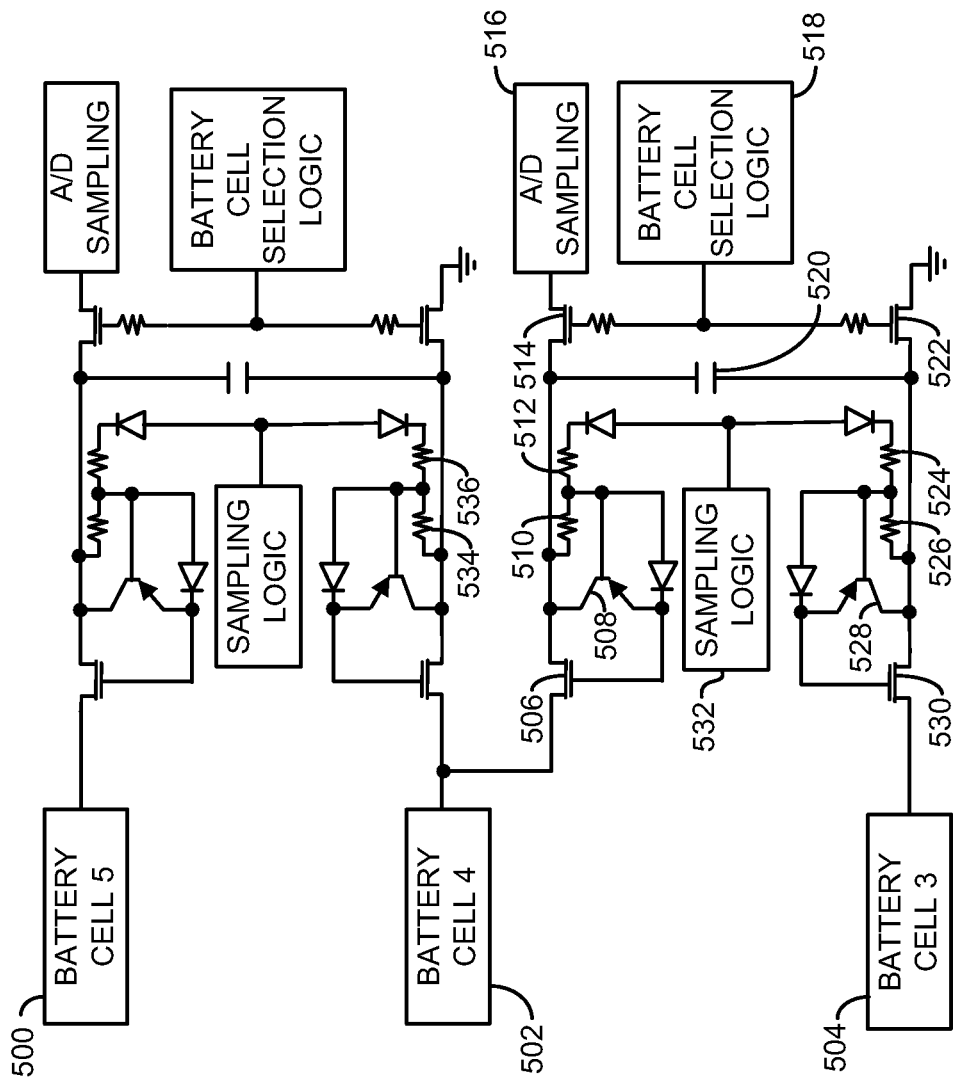
FIG. 5 shows a schematic view of example battery cell monitoring control circuitry.
Figure 6:
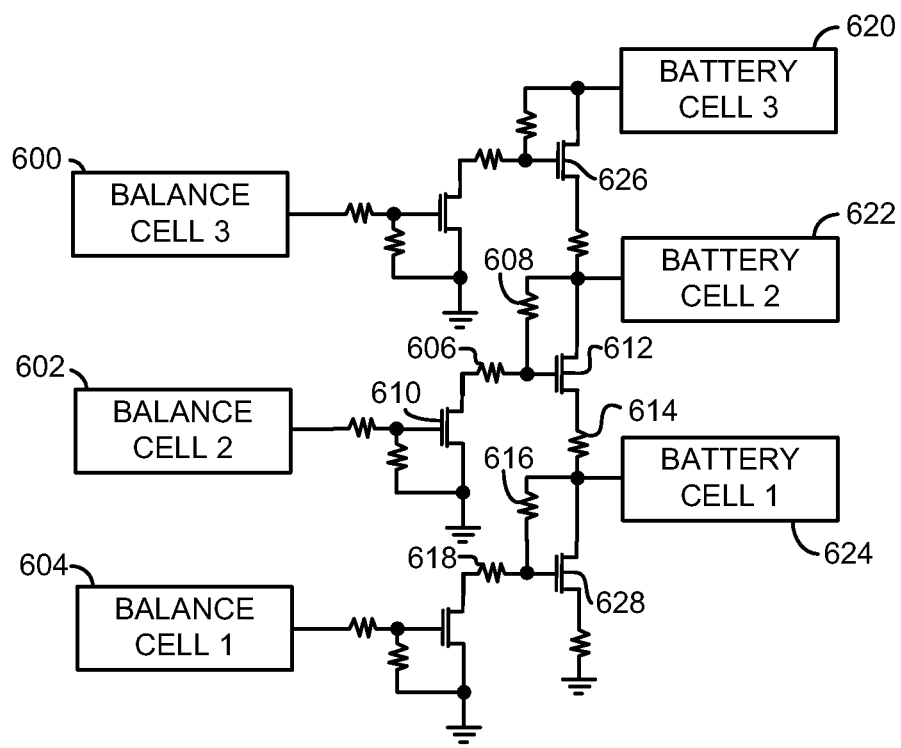
FIG. 6 shows a schematic view of example battery cell balancing control circuitry.

MBB 420 includes a plurality of monitor and balance circuits for which additional description is provided in FIG. 5 and FIG. 6. In applications where less than the total number of battery cell monitor and balance circuits are used to monitor and balance battery cells of a battery stack, unused battery cell monitor and balance circuits may be depopulated to reduce MBB cost. When battery cell monitor and balance circuits are depopulated, zero ohm jumpers are installed on the MBB in place of the depopulated circuits. The zero ohm jumpers provide continuity between circuits. Continuity between circuits is desirable because battery cells are monitored with respect to adjacent battery cells. For example, since some battery cells are connected in series, at one side of a monitored battery cell may be a voltage reference defined by the sum of battery cell voltages earlier in the series battery cell string. Thus, to determine the voltage of the battery cell monitored, the battery cell monitored may be referenced to the voltage of an adjacent battery cell rather than ground, for example. A specific example of the use of zero ohm jumpers is described in FIG. 7.

MBB 420 also includes biasing resistors that vary depending on the number of populated monitor and balance circuits. The bias resistors are sized differently such that the appropriate current flows to transistors used to switch between states of the monitor and balance circuits even though the transistors are exposed to different reference voltages (e.g., the voltage of an adjacent battery cell in a battery stack).

Battery cells 416 and MBB circuitry are coupled by way of connectors 412 and 414. Connectors 412 and 414 are keyed depending on or corresponding to the MBB and battery cell stack battery cell configurations. In particular, connectors 412 and 414 include inserts that reduce the possibility of combining a battery cell stack with an MBB that is not populated to monitor the number of battery cells included in the cell stack. For every possible number of battery cells included in a battery cell stack, there is a unique connector insert arrangement that reduces the possibility of matching the MBB to an undesirable battery cell stack. In this way, it is possible to provide scalable battery cell monitoring and balancing with reduced possibility of configuration differences between the MBB and battery cell stack.

Referring now to FIG. 5, a schematic view of an example simplified battery cell monitoring control circuitry is shown. FIG. 5 shows one type of battery cell monitoring input circuit although other circuit variations may also be anticipated although not shown.

MBB circuitry can be configured to monitor a variable number of battery cells and each battery cell may be referenced to a different voltage (e.g., an adjacent battery cell voltage). FIG. 5 depicts the higher potential sides of battery cells 3-5 at 500-504. Note that although battery cells of a cell stack may be coupled in parallel, the MBB monitors series connected battery cells. Battery cells coupled in parallel are treated as a single battery cell when coupled in series with other battery cells.

The MBB battery cell monitoring and balancing is controlled by a microcontroller. The microcontroller decides under what conditions battery cells are monitored and when sampling of the battery cells occurs. Battery cell selection logic from the microcontroller is simplified and illustrated at 518. Battery cell selection logic activates and deactivates field effect transistors (FET) 514 and 522. When FETs 514 and 522 are activated battery cell voltage may be sampled by A/D converter 516. Battery cell voltage may be sampled across capacitor 520 when FETs 506 and 530 are conducting.

The operating state of FETs 506 and 530 is controlled by PNP transistors 508 and 528. The operating state of PNP transistors 508 is controlled by current that flows from bias resistors 510 and 512 through PNP transistor 508. The operating state of PNP transistors 528 is controlled by current that flows from bias resistors 524 and 526 through PNP transistor 528. The current that flows from bias resistors 510 and 512, as well as current that flows from bias resistors 526 and 524, depends on the level of voltage available at sampling logic block 532 and the bias resistor values. The bias resistor value varies as the battery reference value varies. For example, as the number of battery cells increase and the low side of the monitored battery potential increases from ground reference, resistance of one of the bias resistors decreases. Thus, bias resistors 534 and 536 may be different than similarly placed bias resistors 526 and 524.

Sampling logic block 532 is comprised of circuitry that allows the MBB microcontroller to vary the transistor drive current depending on the voltage level of battery cell being sampled. In one example, a first circuit topology using PNP transistors are such as those illustrated in FIG. 5 are used to couple battery cells that are closer in potential to the ground reference to the A/D sampling circuitry, while in a second circuit and second topology, NPN transistors are used to couple battery cells that are closer in potential to the higher level voltage potential (e.g., the potential of the 16th battery cell in a 16 cell battery stack). However, a majority of the monitor circuits can be configured in the PNP configuration illustrated in FIG. 5 because the desired transistor switching may be facilitated by adjusting bias resistors.

Referring now to FIG. 6, a schematic view of example battery cell balancing control circuitry is shown. The high potential sides of battery cells 1-3 is shown at 620-624. Since the battery cells are coupled in series, the low side of one battery is coupled to the higher potential of another battery cell. Battery cell balancing may be initiated by a microcontroller on the MBB. Simplified microcontroller output circuitry to balance battery cells is illustrated at 600-604.

The battery cell balancing circuitry illustrated for battery cells 1-3 is substantially the same between battery balancing circuits except for transistor biasing resistors for the FET transistors that switch load resistors in parallel with battery cells. The biasing resistors are adjusted to compensate for the changing potential for each additional battery cell in the series of battery cells.

Charge of battery cell number 2 is reduced when FET 612 is activated (e.g., closed) thereby coupling load resistor 614 in parallel to battery cell number 2. FET 612 is activated when FET 610 conducts from a signal initiated by microcontroller signal input 602. When FET 610 conducts, one side of resistor 606 is referenced to ground while the other side is coupled to resistor 608 which is turn is coupled to the high potential side of battery cell number 2. Thus, the voltage developed between resistor 606 and 608, as applied to the gate of FET 612, is related to the voltage of battery cell number 2 with respect to ground and the ratio of resistances 606 and 608. FETs 626 and 628 that balance battery cell numbers 1 and 3 are the same as FET 612. Since the potential of battery cell 3 with respect to ground increases from that of battery cell number 2, the bias resistors coupled to the gate of FET 626 are adjusted to ensure FET 626 switches when microcontroller circuit input 600 changes state. Likewise, the potential of battery cell 1 with respect to ground decreases from that of battery cell number 2, and bias resistors 616 and 618 coupled to the gate of FET 628 are adjusted to ensure FET 628 switches when microcontroller circuit input 604 changes state.

Figure 7:
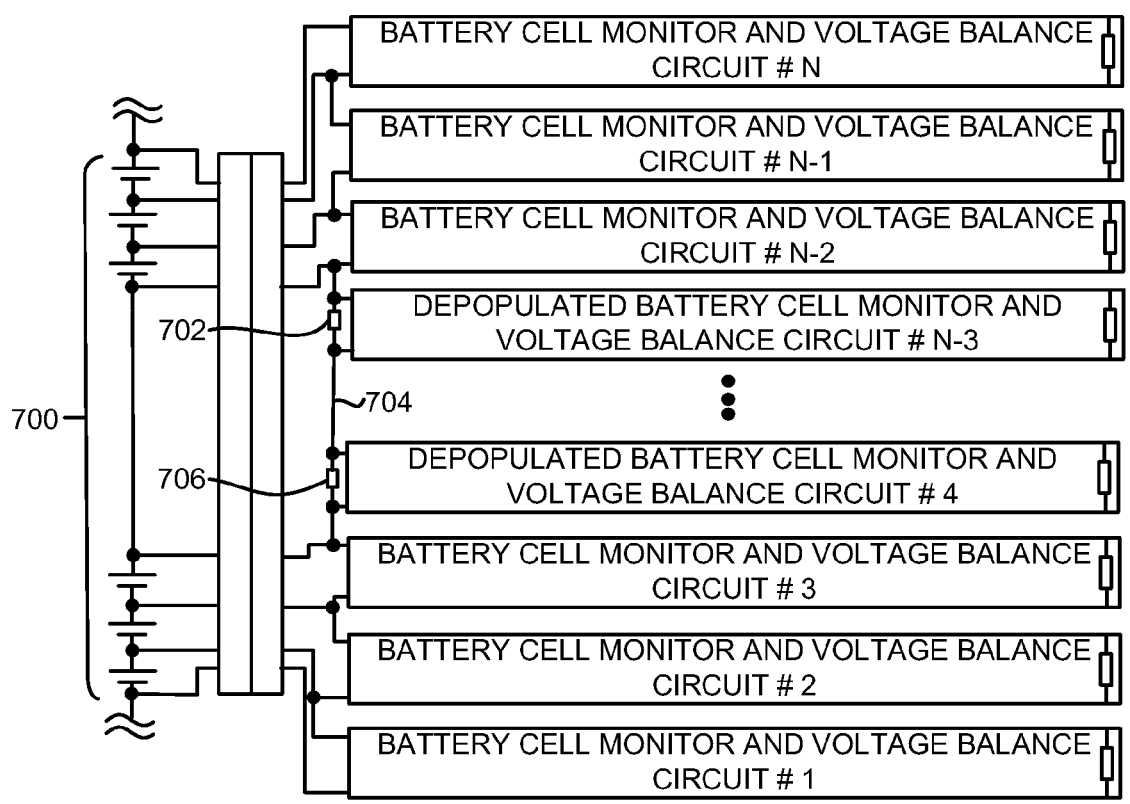
FIG. 7 shows a schematic view of example battery cell monitor and balance board reconfigurable jumpers.

Referring now to FIG. 7, a schematic view of example battery cell MBB with reconfigurable jumpers is shown. FIG. 7 is similar to FIG. 4 but operation of zero ohm jumpers is described in more detail. Monitor and balance circuits 1-3 and N-2 to N are configured to monitor battery cells 700. Monitor and balance circuits 4 and N-3 are depopulated for a battery cell stack that has less than a maximum number of battery cells. Zero ohm jumpers 702 and 706 provide a conductive bridge between monitor and balance circuits 3 and N-3. As discussed and illustrated above, monitor and balance circuits reference each battery cell from the low potential side and the high potential side. By coupling the high potential side of battery cell 3 to the low potential side of battery cell monitor circuit N-3, the monitor and balance circuits can access both sides of all battery cells in the battery cell stack. Link 704 represents zero ohm jumper circuits between monitor and balance circuit 3 and circuit N-3. Thus, for each depopulated monitor and balance circuit, a zero ohm jumper provides a conductive link between populated circuits. When a monitor and balance circuit is populated to monitor and balance a battery cell, the zero ohm jumper is omitted.

Figure 8:
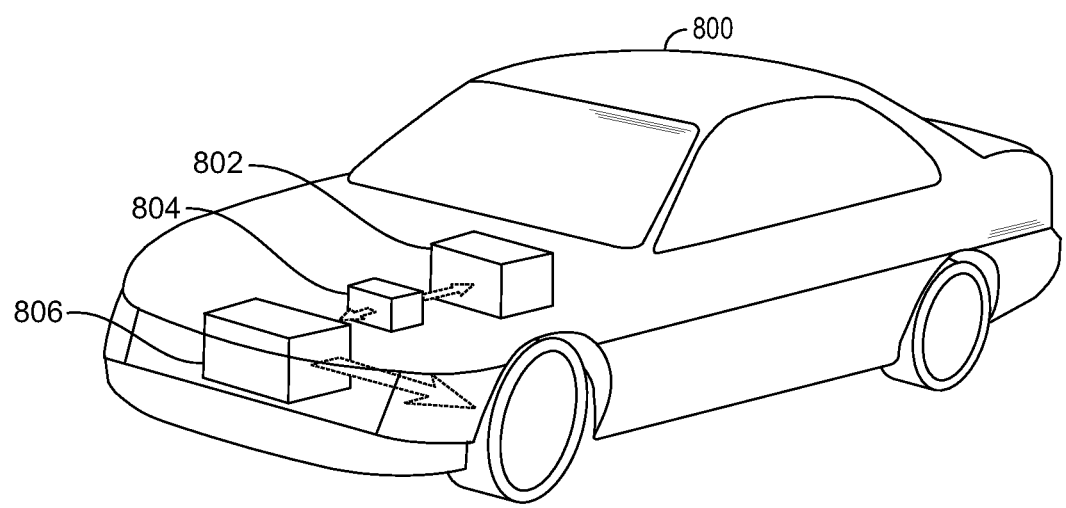
FIG. 8 shows a schematic view of battery control system in a motor vehicle.

Turning to FIG. 8, a schematic view of a non-limiting application of the present system and method is shown. In particular, battery pack 802 is installed in a vehicle 800 for the purpose of supplying energy to propel vehicle 800 by way of electric motor 806. As shown in FIG. 8, vehicle controller 804 may facilitate communication between battery pack 802 and motor 806. In one embodiment, vehicle 800 may be propelled solely by electric motor 806. In another embodiment, vehicle 800 may be a hybrid vehicle that may be propelled by an electric motor and an internal combustion engine.

Thus, FIGS. 1-8 provide for a system for controlling monitoring and voltage balancing of individual battery cells within a battery pack supplying power to a vehicle, comprising: a circuit board comprising a plurality of battery cell monitor and voltage balance circuits, said plurality of battery cell monitor and balance circuits configurable to monitor a variable number of battery cells, a number of said plurality of battery cell monitor and voltage balance circuits populated corresponding to a number of battery cells monitored. The system also includes where the plurality of battery cell monitor and balance circuits include a group of circuits having a first topology and a group of circuits having a second topology, the first topology different from the second topology. In this way, a wide range of battery systems may be constructed from a limited number of components. The system also includes where the first topology is related to a first battery cell of a battery cell stack. In at least one example, the system includes where the number of populated circuits varies with a number of battery cells of a battery cell stack that are monitored. The system includes where the plurality of cell monitor circuits include a capacitor for each of said plurality of battery cells monitored, each of the capacitor is coupled in parallel to one of each of said battery plurality of battery cells. In still other examples, the system includes where each circuit of the plurality of voltage balance circuits includes switch and a load resistor, said load resistor connected in parallel with a battery cell of a battery cell stack when said switch is closed.

FIGS. 1-8 also provide for a system for controlling monitoring and voltage balancing of individual battery cells within a battery pack supplying power to a vehicle, comprising: a circuit board comprising a plurality circuits; and a first and second resistor, said first and second resistor connected in series between a first reference and a second reference, said first resistor and said second resistor sized to produce a unique voltage related to a number of populated circuits included in said plurality of circuits. The system also includes where the circuit board further includes a connector uniquely keyed to the number of populated circuits. In this way, the system configuration of a battery system may be verified so that a single group of computer instructions may operate and monitor the battery system. The system also includes where the battery cell charge reducing circuitry includes a load resistor. The system includes where the number of populated circuits varies with a number of battery cells of a battery cell stack that are monitored. Further, in at least one example, the system comprises a power supply coupled to the number of battery cells of a battery cell stack that are monitored. The system includes where each circuit of the plurality of circuits includes a switch and a load resistor, the load resistor connected in parallel with a battery cell of a battery cell stack when the switch is closed. The system includes a microcontroller coupled to said plurality of circuits. Thus, a single microcontroller can be coupled to a wide range of circuit configurations to control, monitor, and balance a battery pack.

Figure 9:
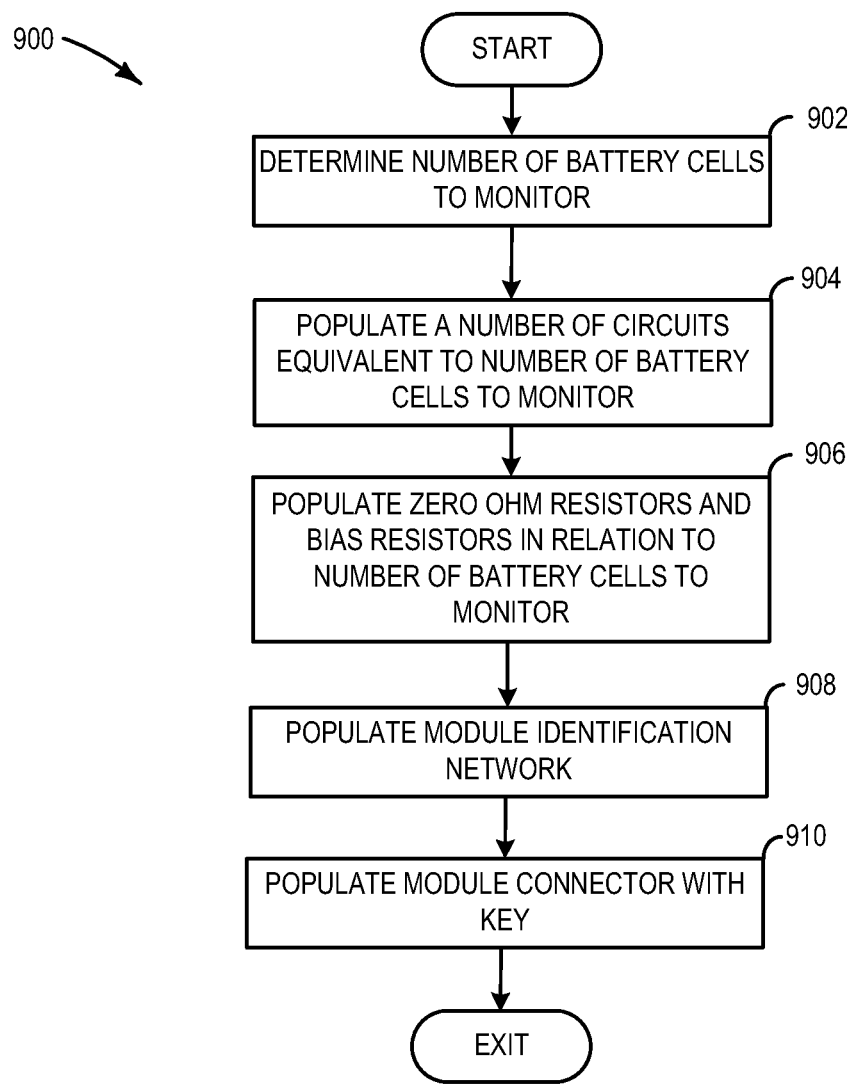
FIG. 9 shows a flow chart illustrating a method for configuring a monitor and balance board for a battery cell stack.

Referring now to FIG. 9, a flow chart illustrating a method for configuring a monitor and balance board for a battery cell stack is shown. At 902, method 900 determines the number of battery cells to monitor. The number of battery cells in a particular battery cell stack may be determined from battery pack voltage and current requirements as well as from packaging restraints. As discussed above, battery cells are coupled in series to increase battery pack voltage. Battery cells are coupled in parallel to increase battery pack current capacity.

At 904, the method populates each MBB of a battery pack according to the number of battery cells in a cell stack. If one MBB is used to monitor an entire battery cell stack the number of monitor and balance circuits populated on the MBB corresponds to the number of battery cells coupled in series. If more than one MBB is used to monitor a battery cell stack, monitoring and balancing circuits of battery cells coupled in series is divided between the boards.

At 906, MBB zero ohm resistors and bias resistors are populated according to whether or not the monitor and balance circuits are populated and according to the voltage of the battery cell being monitored and balanced. If a monitor and balance circuit is not populated because no battery cell is monitored, a zero ohm jumper is coupled to the MBB so that adjacent battery cells can be monitored and balanced by the MBB. If a monitor and balance circuit is populated, the bias resistors and transistors are selected so that the transistors will switch when coupled to the battery cells of the battery cell stack. In particular, the bias resistors are selected so that there is sufficient current to switch PNP or NPN transistors.

At 908, the configuration resistors that relate the number of battery cells the MBB is configured to monitor to a voltage are populated. Two resistors form a voltage divider and output a unique voltage when coupled to the MBB power supply. The MBB microcontroller may read the voltage across one of the resistors to determine the MBB configuration. In one example, the resistors are selected to provide at least 0.25 volts for every battery cell that may be monitored by the MBB. However, the output voltage of the voltage divider network may be higher or lower than 0.25 volts per battery cell monitored.

At 910, a connector with proper keying for the number of battery cells the MBB is configured to monitor is populated. Method 900 exits after 910.

Figure 10:
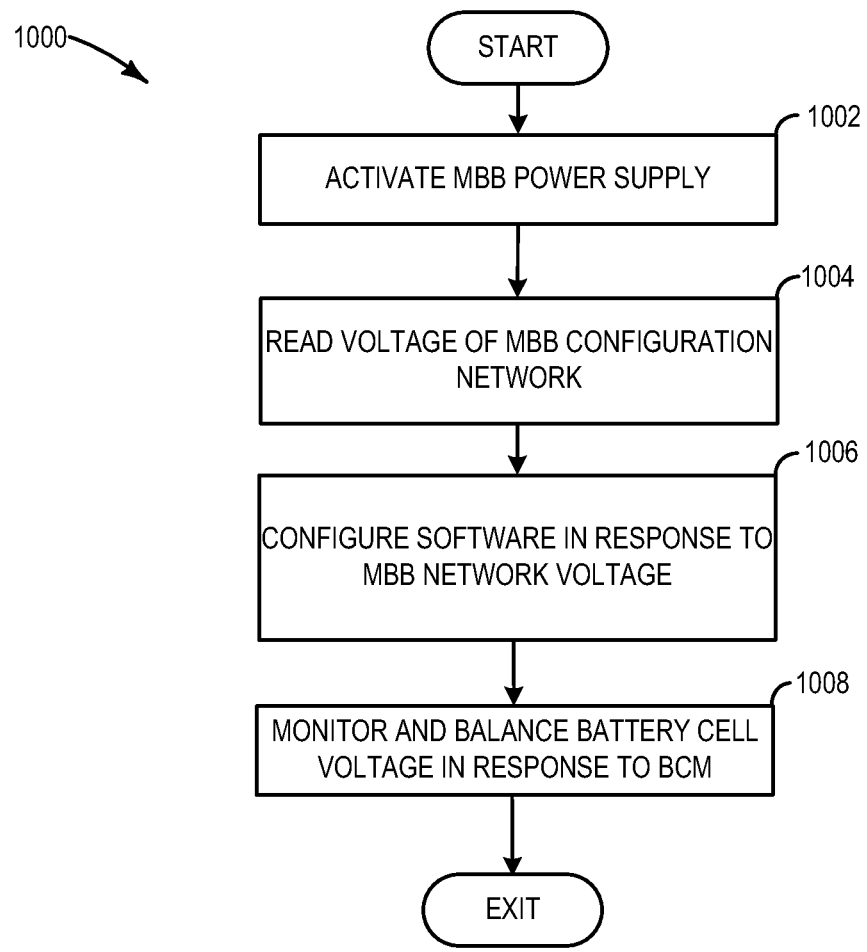
FIG. 10 shows a flow chart illustrating a method for configuring software for a battery control module.

Referring now to FIG. 10, a flow chart illustrating a method for configuring software for a battery control module is shown. At 1002, method 1000 activates the MBB power supply. In one embodiment, the MBB power supply is activated by changing the state of a digital output of a microcontroller coupled to the BCM. The BCM may activate the MBB power supply when the battery pack transitions from a sleep or low power mode to an operate mode.

At 1004, the MBB microcontroller reads the output of a resistor voltage divider circuit. The voltage is compared to a map of MBB configurations stored in memory of the MBB. The MBB configuration map converts the voltage output by the voltage divider to a MBB configuration that indicates the number of battery cells that may be monitored by the MBB.

At 1006, the MBB configures its software in response to the voltage output by the voltage divider present on the MBB. In one example, pointers and indexes in the software may be modified in response to this voltage. In one embodiment, an index that directs the MBB microcontroller to sample which battery cells of a battery cell stack is increased as the voltage across a configuration resistor increases. For example, when a voltage across a configuration resistor is 2.25 volts, the MBB issues instructions to monitor and balance eight battery cells of a battery cell stack based on a battery cell index of 8. When the voltage across a configuration resistor is 2.5 volts, the MBB issues instructions to monitor and balance nine battery cells of a battery cell stack based on a battery cell index of 9. Thus, software in the MBB may self configure in response to MBB voltage divider outputs. Accordingly, one MBB source code may be utilized for a range of battery cell stack applications.

At 1008, the BCM issues monitoring and balancing instructions to the MBB microcontroller. The BCM may control a plurality of MBB boards in the battery cell pack as well as other functions such as communications with a vehicle controller. Therefore, the BCM may monitor and balance battery cells of different battery cell stacks at different times. Further, the BCM may issue different instructions to different MBBs in response to the configuration of each MBB. When the BCM makes monitor and balancing requests to the MBB, the MBB activates appropriate switches so that battery cell voltage is available to A/D converters and so that battery cells that may be above a threshold voltage are discharged. Method 1000 exits after 1008.

Thus, the methods of FIGS. 9 and 10 provide for monitoring and voltage balancing a battery cell stack, the battery cell stack comprising a plurality of battery cells, a number of the battery cells varying between different battery cell stacks, the method comprising: populating a number of monitoring and voltage balancing circuits on a circuit board, the number of monitoring and voltage balancing circuits varying between a first number of circuits and a second number of circuits; populating a resistor network with resistors that relate to the number of populated monitoring and voltage balancing circuits on the circuit board; and coupling a power supply in parallel with the plurality of battery cells. In one example, a voltage across the resistor can be read to determine the battery pack configuration. In this way, circuit boards that are common to battery packs may be configure to form a unique battery pack. The method includes where the draining of a portion of charge from said at least one battery cell is controlled by a microcontroller, and where the plurality of battery cells are lithium-ion battery cells. In one example, the method includes where the power supply is a linear pass regulated power supply. The method also includes where the circuit board is coupled to the battery cell stack via a connector uniquely keyed to correspond with the populated number of monitoring and voltage balancing circuits. Thus, the method includes multiple ways to verify system configuration. The method includes where the power supply is coupled to the circuit board and powered by the plurality of battery cells. The method also includes where the power supply is coupled to the resistor network. In this way, the battery pack software and instructions can be automatically configured.

The methods of FIGS. 9 and 10 also provide for a method for monitoring and voltage balancing a battery cell stack, said battery cell stack comprising a plurality of battery cells, a number of said battery cells varying between different battery cell stacks, the method comprising: activating a power supply; sensing a voltage of a circuit board coupled to a battery cell stack, said voltage related to an output of said power supply; configuring software instructions in response to said voltage; and monitoring and balancing battery cell voltages in response to said software instructions. In this way, a single set of instructions may be configured to operate a wide range of battery pack configurations. The method includes where the sensed voltage is a voltage between a first resistor and a second resistor. The method includes where the battery cell stack is comprised of lithium-ion battery cells. However, other typed of battery cells may also be used in the battery pack. The method includes where the voltage is produced by a power supply powered by a battery cell stack.

The methods of FIGS. 9 and 10 also provide for delivering power to circuits coupled to a plurality of battery cells, comprising: coupling a first power supply to a first group of battery cells of the plurality of battery cells, the first group of battery cells configured to output a first voltage, the first voltage input to the first power supply; coupling a second power supply to a second group of battery cells of the plurality of battery cells, said second group of battery cells configured to output a second voltage different from the first voltage, the second voltage input to the second power supply; and the first and second power supplies draining the plurality of battery cells of charge substantially equally. In this way, battery cells of the battery pack may be kept in balance. The method includes where the first and second power supplies draw substantially the same amount of current from the first group of battery cells and from the second group of battery cells. The method includes where the first and second power supplies are linear pass regulator power supplies. The method includes where the first group of battery cells comprises a first battery cell stack and where the second group of battery cells comprise a second battery cell stack.

The subject matter of the present disclosure includes all novel and nonobvious combinations and subcombinations of the various systems and configurations, and other features, functions, and/or properties disclosed herein.

The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system for controlling monitoring and voltage balancing of individual battery cells within a battery pack supplying power to a vehicle, comprising:
   in a first configuration, a circuit board comprising a plurality of battery cell monitor circuits and voltage balance circuits, said plurality of battery cell monitor circuits and voltage balance circuits populated to monitor N actual total number of battery cells, where N is a number, the circuit board electrically coupled to a plurality of battery cells external to the circuit board;
   in a second configuration, the circuit board comprising the plurality of battery cell monitor circuits and voltage balance circuits populated to monitor less than N actual total number of battery cells, circuits included in the plurality of battery cell monitor circuits and voltage balance circuits not monitoring battery cells not being populated; and
   a controller including executable instructions stored in non-transitory memory to monitor and balance a first actual total number of battery circuits responsive to a first voltage across a voltage divider network and to monitor and balance a second actual total number of battery circuits responsive to a second voltage across the voltage divider network.

2. The system of claim 1, wherein said plurality of battery cell monitor circuits includes a group of circuits having a first topology and a group of circuits having a second topology, said first topology different from said second topology, and further comprising:
   a first and a second resistor included with the circuit board, said first and second resistors connected in series between a first reference and a second reference, said first resistor and said second resistor sized to produce a unique voltage representing an actual total number of populated monitoring circuits and voltage balancing circuits included in the circuit board.

3. The system of claim 2, wherein said first topology is related to a first battery cell of a battery cell stack.

4. The system of claim 1, wherein said plurality of battery cell monitor circuits and voltage balance circuits populated on the circuit board to monitor less than N actual total number of battery cells varies with a total actual number of battery cells of a battery cell stack that are monitored.

5. The system of claim 1, wherein said plurality of battery cell monitor circuits includes a capacitor for each of said plurality of battery cells monitored, each of said capacitors coupled in parallel to one of each of said plurality of battery cells, and further comprising two bias resistors in the plurality of battery cell monitoring circuits to control current flow to a PNP transistor that controls an operating state of a field effect transistor to select a battery cell in the plurality of battery cells for sampling, a resistance value of one of the two bias resistors based on a voltage of the battery cell in the plurality of battery cells relative to ground.

6. The system of claim 1, wherein each circuit of said plurality of voltage balance circuits includes a switch and a load resistor, said load resistor connected in parallel with a battery cell of a battery cell stack when said switch is closed.

7. A system for controlling monitoring and voltage balancing of individual battery cells within a battery pack supplying power to a vehicle, comprising:
   a circuit board comprising a plurality of monitoring circuits and balancing circuits, the circuit board electrically coupled to a plurality of battery cells external to the circuit board; and
   a first and a second resistor included with the circuit board, said first and second resistors connected in series between a first reference and a second reference, said first resistor and said second resistor sized to produce a unique voltage representing an actual total number of populated monitoring circuits and voltage balancing circuits included in the circuit board.

8. The system of claim 7, wherein said circuit board further includes a connector uniquely keyed to said number of populated circuits, and further comprising a controller including executable instructions stored in non-transitory memory to adjust an actual total number of monitoring circuits sampled based on the unique voltage.

9. The system of claim 7, wherein the plurality of voltage balancing circuits include a plurality of load resistors, and further comprising two bias resistors in the plurality of monitoring circuits to control current flow to a PNP transistor that controls an operating state of a field effect transistor to select a battery cell in the plurality of battery cells external to the circuit board for sampling, a resistance value of one of the two bias resistors based on a voltage of the battery cell in the plurality of battery cells external to the circuit board relative to ground.

10. The system of claim 7, wherein said actual total number of populated monitoring circuits and voltage balancing circuits varies with an actual total number of battery cells of a battery cell stack that are monitored.

11. The system of claim 10, further comprising a power supply coupled to battery cells included in said actual total number of battery cells of the battery cell stack that are monitored and draining current from the plurality of battery cells within the battery pack.

12. The system of claim 7, wherein each circuit of said plurality of monitoring circuits and balancing circuits includes a switch and a load resistor, said load resistor connected in parallel with a battery cell of a battery cell stack when said switch is closed.

13. The system of claim 7, further comprising a microcontroller coupled to said plurality of monitoring circuits and balancing circuits and zero ohm resistors and jumpers connecting depopulated circuits to populated circuits.

14. A method for monitoring and voltage balancing a battery cell stack, said battery cell stack comprising a plurality of battery cells, an actual total number of said battery cells varying between different battery cell stacks, the method comprising:
  populating an actual total number of monitoring and voltage balancing circuits on a circuit board up to N monitoring and voltage balancing circuits, where N is a maximum number of battery cells arranged in series, said actual total number of monitoring and voltage balancing circuits varying between a first number of circuits and a second number of circuits, said circuit board electrically coupled to said plurality of battery cells external to said circuit board, and not populating at least one monitoring and voltage balancing circuit from said circuit board when less than N battery cells are monitored;
  populating a resistor network on said circuit board with resistors based on said actual total number of populated monitoring and voltage balancing circuits on said circuit board; and
  coupling a power supply in parallel with said plurality of battery cells, the power supply discharging the plurality of battery cells.

15. The method of claim 14, wherein said power supply drains a portion of charge from at least one battery cell of said plurality of battery cells and is controlled by a microcontroller, and further comprising adjusting an actual total number of monitoring circuits sampled based on a voltage across a voltage divider network.

16. The method of claim 14, wherein said power supply is a linear pass regulated power supply.

17. The method of claim 14, wherein said circuit board is coupled to said battery cell stack via a connector uniquely keyed to correspond with said populated actual total number of monitoring and voltage balancing circuits.

18. The method of claim 14, wherein said power supply is coupled to said circuit board and powered by said plurality of battery cells.

19. The method of claim 14, wherein said power supply is coupled to said resistor network.

20. The method of claim 14, wherein said battery cell stack is comprised of lithium-ion battery cells.

* * * * *